United States Patent [19]
Krishnan et al.

[11] Patent Number: 5,380,546
[45] Date of Patent: Jan. 10, 1995

[54] MULTILEVEL METALLIZATION PROCESS FOR ELECTRONIC COMPONENTS

[75] Inventors: Ajay Krishnan; Nalin Kumar, both of Austin, Tex.

[73] Assignee: Microelectronics and Computer Technology Corporation, Austin, Tex.

[21] Appl. No.: 75,062

[22] Filed: Jun. 9, 1993

[51] Int. Cl.⁶ .............................................. B05D 5/12
[52] U.S. Cl. .................................. 427/126.1; 427/271; 427/307; 427/367; 427/376.7; 427/443.1
[58] Field of Search ............... 427/126.1, 307, 271, 427/367, 376.7, 443.1

[56] References Cited

U.S. PATENT DOCUMENTS

| | | | |
|---|---|---|---|
| 4,417,393 | 11/1983 | Becker | 29/846 |
| 4,486,946 | 12/1984 | Jopke, Jr. et al. | 29/590 |
| 5,011,580 | 4/1991 | Pan et al. | 204/15 |
| 5,091,339 | 2/1992 | Carey | 437/187 |
| 5,116,463 | 5/1992 | Lin et al. | 156/643 |
| 5,118,385 | 6/1992 | Kumar et al. | 156/644 |
| 5,137,597 | 8/1992 | Curry, II et al. | 156/636 |
| 5,142,828 | 9/1992 | Curry, II | 51/281 |
| 5,164,332 | 11/1992 | Kumar | 437/198 |
| 5,173,442 | 12/1992 | Carey | 437/173 |
| 5,211,807 | 5/1983 | Yee | 156/664 |
| 5,219,787 | 6/1993 | Carey et al. | 437/187 |

OTHER PUBLICATIONS

Bennett et al., "Selective Planarization Process and Structures," *IBM Technical Disclosure Bulletin*, Sep. 1984, Armonk, N.Y., pp. 2560–2563.

Koburger, "Trench Planarization Technique," *IBM Technical Disclosure Bulletin*, Nov. 1984, Armonk, N.Y., pp. 3242–3243.

Beyer et al., "Glass Planarization by Stop-Layer Polishing," *IBM Technical Disclosure Bulletin*, Jan. 1985, Armonk, N.Y., pp. 4700–4701.

Kaanta et al., "Dual Damascene: A Ulsi Wiring Technology," *Proceedings of the Eighth International IEEE VLSI Multilevel Interconnection Conference*, Jun. 11–12, 1991, Santa Clara, Calif., pp. 144–152.

Ray et al., "Dual-Level Metal (DLM) Method for Fabricating Thin Film Wiring Structures," 1993 *Proceedings 43rd Electronic Components & Technology Conference*, Jun. 1–4, 1993, Orlando, Fla., pp. 538–543.

*Primary Examiner*—Shrive Beck
*Assistant Examiner*—Benjamin L. Utech
*Attorney, Agent, or Firm*—David M. Sigmond; James E. Ruland

[57] ABSTRACT

A maskless process for forming a protected metal feature in a planar insulating layer of a substrate is disclosed. A first barrier material is disposed in a recess in an insulating layer, a conductive metal is disposed on the first barrier material such that the entire metal feature is positioned within the recess below the top of the recess, a second barrier material is disposed on the metal feature such that the second barrier material occupies the entire portion of the recess above the metal feature and extends above the top surface of the insulating layer, and the second barrier material is then polished until the top of the second barrier material is in and aligned with the top of the insulating layer. As a result, the metal feature is surrounded and protected by the first and second barrier materials, and the substrate is planarized.

15 Claims, 7 Drawing Sheets

MULTILEVEL METALLIZATION PROCESS FOR ELECTRONIC COMPONENTS

BACKGROUND OF THE INVENTION

1. Field of the Invention

The invention relates to processes for forming metallization in insulating layers, and more particularly to forming metal features surrounded by an adhering diffusion barrier in an insulating layer of an electronic component using a maskless process.

2. Description of Related Art

In the evolution of integrated circuit chips, scaling down feature sizes improves performance of internal devices in the chips by increasing the speed and functional capability of the devices. As the devices get smaller, however, their performance becomes more heavily dependent on the interconnections between them. Likewise, as the number of devices per chip increases, the area required to route the interconnect lines exceeds the area occupied by the devices. This normally leads to integrated circuit chips with multilevel interconnect schemes.

In advanced microelectronic packaging of integrated circuits, particularly high-speed, high-density packaging for main frame computer applications, the chips are often mounted on multi-chip modules such as copper/polyimide substrates which contain buried wiring patterns to conduct electrical signals between various chips. These modules usually contain multiple layers of interconnect metallizations separated by alternating layers of an isolating dielectric whose function is to serve as electrical isolation between the metal features.

Any conductor material to be used in a multilevel interconnect has to satisfy certain essential requirements such as low resistivity, resistance to electromigration, adhesion to the underlying substrate material, stability (both electrical and mechanical) as ease of processing. Copper is often preferred due to its low resistivity, high electromigration resistance and stress voiding resistance.

Copper unfortunately suffers from high diffusivity in common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required.

The copper must also be patterned. Photolithography is a common approach wherein patterned layers are usually formed by spinning on a layer of photoresist, projecting light through a photomask with the desired pattern onto the photoresist to expose the photoresist to the pattern, developing the photoresist, washing off the undeveloped photoresist, and plasma etching to clean out the areas where the photoresist has been washed away. The exposed resist may be rendered insoluble (positive-working) and form the pattern, or insoluble (negative-working) and be washed away. In either case, the remaining resist on the surface forms the desired pattern. Photoresist, however, not only consumes time and resources but also endangers contamination from particulates and etchant solutions.

Dry etches may also be employed in copper patterning processes employing masks. However, dry etches tend to be resisted by copper. In addition, dry etches are expensive due to the high capitol cost of reaction ion etch (RIE) systems and are limited in application because they require a hard mask such as nickel, aluminum or gold.

Thus, a method of patterning copper without photolithography or dry etching is desirable.

Regardless of the conductor material or patterning technique, planarization of the interlayer dielectric is crucial for obtaining a multilevel structure that allows accurate lithographic patterning. The deposition and etchback tolerances associated with large film thicknesses are cummulative, and any non-planarity of the resist is replicated in the final top surface of the device. Chemical-mechanical polishing is a fast and efficient approach for achieving planarity in multichip modules and integrated circuits.

SUMMARY OF THE INVENTION

The objects outlined above are in large part achieved by the present invention. That is, the process hereof forms metal features (such as copper) surrounded by an adhering barrier in an planarized insulating layer (such as silicon oxide or polyimide) using a maskless process (without photolithography or reactive ion etching) using a small number of conventional process steps.

Broadly speaking, the present invention provides a maskless process for forming a protected metal feature in a planar insulating layer of substrate. A first barrier material is disposed in a recess in an insulating layer, a conductive metal is disposed on the first barrier material such that the entire metal feature is positioned within the recess below the top of the recess, a second barrier material is disposed on the metal feature such that the second barrier material occupies the entire portion of the recess above the metal feature and extends above the top surface of the insulating layer, and then the second barrier material is polished until the top of the second barrier material is aligned with the top of the insulating layer. As a result, the metal feature is surrounded and protected by the first and second barrier materials, and the substrate is planarized.

The present invention has the advantage of being a robust, high yielding process that is well-suited for manufacturing VLSI and ULSI chips as well as multi-chip modules and other electronic components.

These and other objects, features and advantages of the present invention will be further described and more readily apparent from a review of the detailed description and preferred embodiments which follow.

BRIEF DESCRIPTION OF THE DRAWINGS

The following detailed description of the preferred embodiments can best be understood when read in conjunction with the following drawings, wherein.

DETAILED DESCRIPTION OF THE PREFERRED EMBODIMENTS

Figure 1:
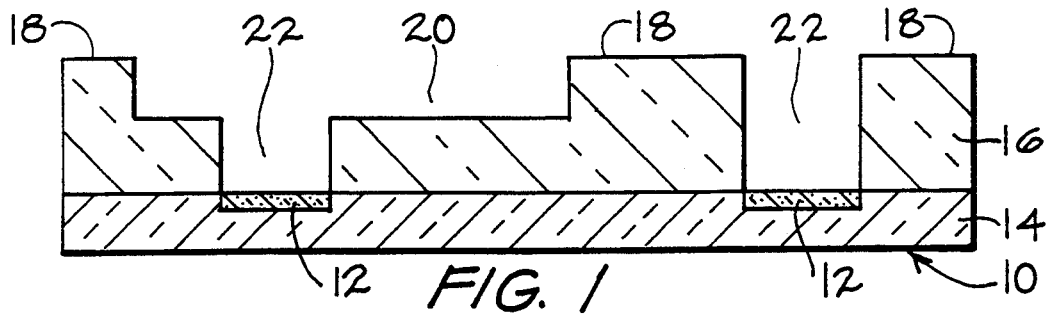
FIGS. 1, 2, 3, 4, 5, 6, 7, 8, 9, and 10 show successive cross-sectional views of forming a metallization layer in accordance with one embodiment of the present invention.

Referring now to the drawings wherein depicted elements are not necessarily shown to scale and wherein like or similar elements are designated by the same reference numeral through the several views and, more particularly to FIG. 1, there is shown a substrate generally designated 10 in accordance with a preferred embodiment of the present invention. Substrate 10 comprises n-doped silicon semiconductors 12 on silicon base 14. A layer of silicon oxide 16 with planar top surface 18 is approximately 0.5 to 5 microns thick and is disposed on silicon base 14. Channels 20 and vias 22 are recessed openings formed in top surface 18 with approximately 2–5 micron feature sizes. Channels 20 extend partially through the thickness of silicon oxide layer 16; vias 22 extend completely through silicon oxide 16 thereby exposing semiconductors 12. Vias 22 may be spaced from, adjacent to or within channels 20. Trenching techniques for forming channels and vias in insulating layers are disclosed in U.S. Pat. Nos. 5,173,442 to Carey and 4,417,393 to Becker.

Figure 2:
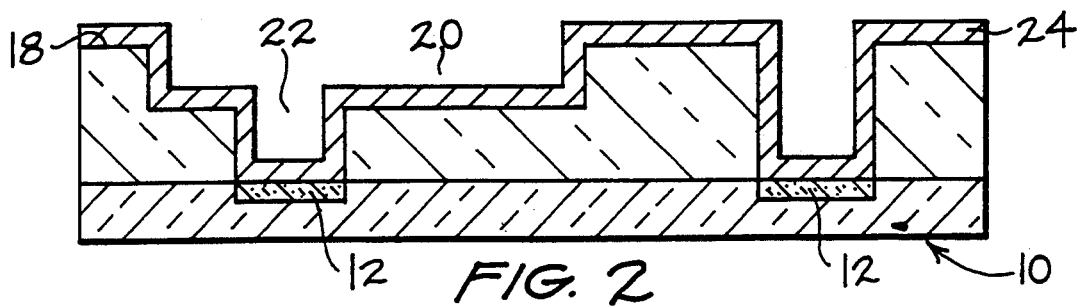

Referring now to FIG. 2. a uniform layer of titanium-tungsten 24 approximately 50 to 2,000 angstroms thick is sputter deposited over the entire substrate 10. Titanium-tungsten 24 makes adhesive electrical contact (ohmic of Schotkey) with semiconductors 12 and adhesive contact with the surfaces in channels 20 and vias 22 and with top surface 18. As is seen, the thickness of titanium-tungsten 24 is substantially less than the thickness of channels 20 or vias 22.

Figure 3:
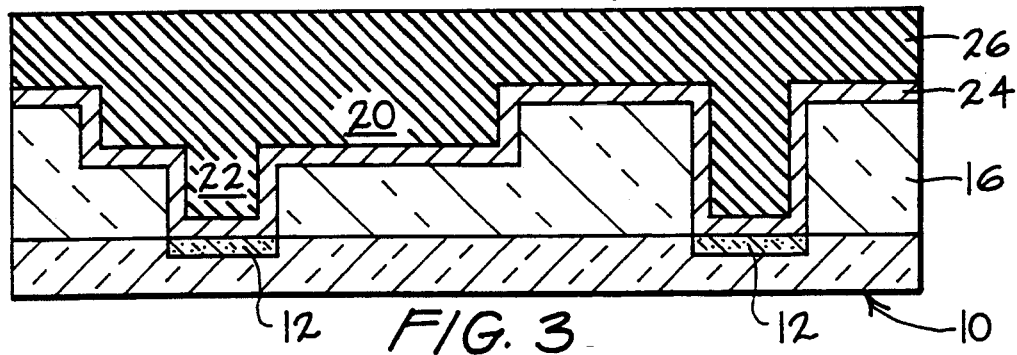

Referring now to FIG. 3, a uniform layer of copper 26 approximately 0.5 to 2 microns thick is sputter deposited over the entire substrate 10. Copper 26 adhesively contacts the exposed surfaces of titanium-tungsten 24 without contacting silicon oxide layer 16 or semiconductors 12. Copper 26 is thick enough to completely fill channels 20 and vias 22 above titanium-tungsten 24. Titanium-tungsten 24 provides a diffusion barrier which prevents copper 26 from diffusing or migrating into silicon oxide 16. The use of titanium-tungsten as a barrier in silicon semiconductor processing of NPN devices is described in U.S. Pat. No. 4,486,946 to Jopke, Jr. et al. Copper diffusion barriers are disclosed in U.S. Pat. No. 5,164,332 to Kumar; and in Japanese Patent Nos. 1-99239 to Tsuya; 1-204449 to Fukada; 1-231351 to Hoshino; 1-232746 to Inoue and 1-239954 to Shimizu.

Figure 4:
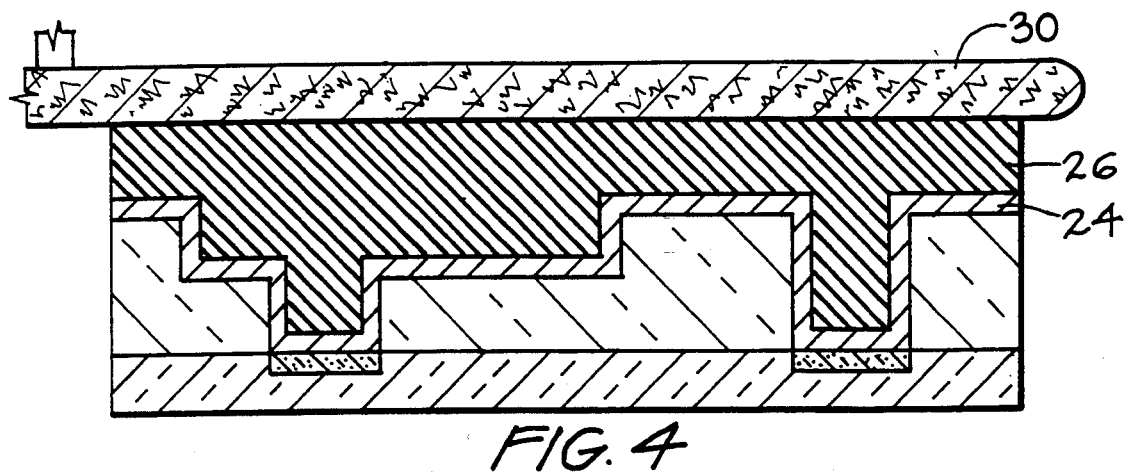

Referring now to FIG. 4, a chemical-mechanical polish comprising a rotating soft pad 30 and a wet chemical (such as an oxidizer, reducer or etchant) is applied to attack and remove copper 26 without removing titanium-tungsten 24. Polishing techniques are disclosed, for instance, in U.S. Pat. Nos. 5,142,828 to Curry, II and 5,137,597 to Curry, II et al; and in Bennett et al: "Selective Planarization Process and Structure," *IBM Technical Disclosure Bulletin*, vol. 27, No. 4B, pp. 2560–2563, September 1984; Koburger, "Trench Planarization Technique," *IBM Technical Disclosure Bulletin*, vol. 27, No. 6, pp. 3242–3243, November 1984; Mutter, "Choice Stop Material for Chemical/Mechanical Polish Planarization," *IBM Technical Disclosure Bulletin*, vol. 27, No. 8, pp. 4642, January 1985; and Beyer et al., "Class Planarization by Stop Layer Polishing," *IBM Technical Disclosure Bulletin*, vol. 27, No. 8, pp. 4700–4701, January 1985. It is noted that polishing in the presence of a colloidal silica (of the type used in polishing semiconductor materials) combined with sodium chlorite can increase the polishing rate of copper while decreasing the polishing rate of titanium-tungsten.

Figure 5:
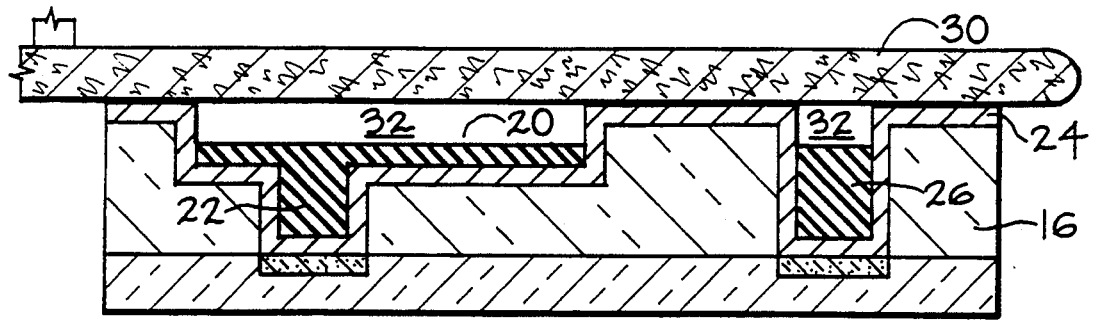

Referring now to FIG. 5, the polish continues until copper 26 is completely removed from titanium-tungsten 24 above silicon oxide 16. While titanium-tungsten 24 is not etched or removed by the polish, and thereby protects the silicon oxide 16 therebeneath, it is essential that copper 26 be removed from the upper portion 32 of channels 20 and vias 22.

Figure 6:
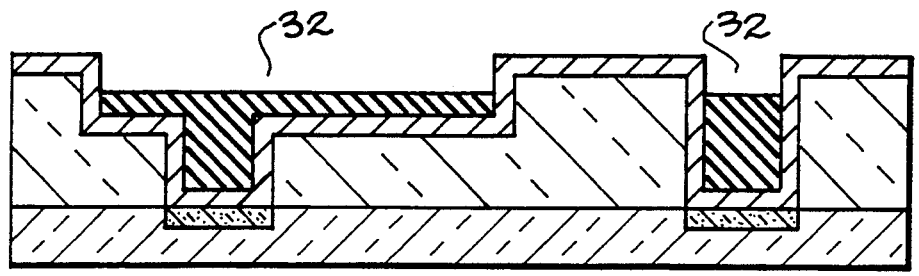

Referring now to FIG. 6, the chemical-mechanical polish is discontinued. Endpoint detection for polishing is described in U.S. Pat. No. 4,793,895 by Kaanta et al.

Figure 7:
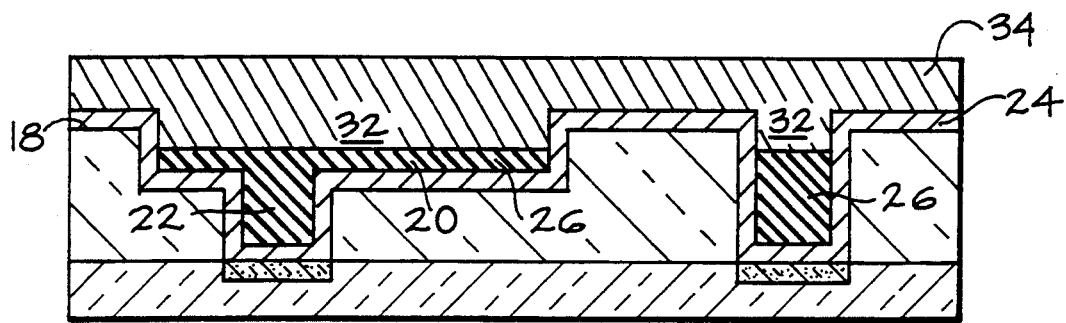

Referring now to FIG. 7, a uniform layer of titanium-tungsten 34 approximately 200 to 2,000 angstroms thick is sputter deposited over the entire substrate 10. Titanium-tungsten 34 makes adhesive electrical contact with copper 26 in channels 20 and vias 22 and with titanium-tungsten 24 which is on top surface 18. Titanium-tungsten 34 is thick enough to completely fill upper portion 32 of channels 20 and vias 22 above copper 26. As a result, copper 26 becomes "capped" since copper 26 is completely surrounded by titanium-tungsten 24 and 34.

Figure 8:
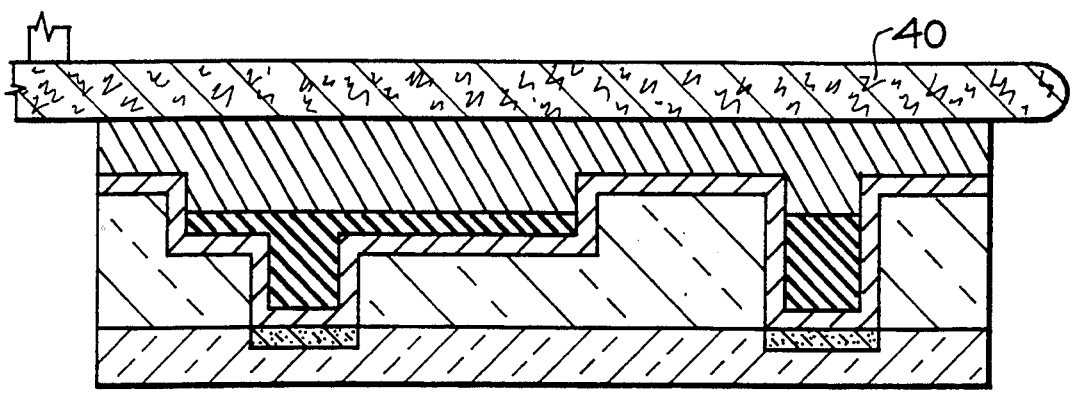

Referring now to FIG. 8, a second polish comprising a rotating pad 40 is applied which attacks the titanium-tungsten. Preferably, the second polish is assisted by a wet chemical etchant that attacks titanium-tungsten without etching silicon oxide. Such titanium-tungsten etching solutions are disclosed in U.S. Pat. No. 5,211,807 to Yee.

Figure 9:
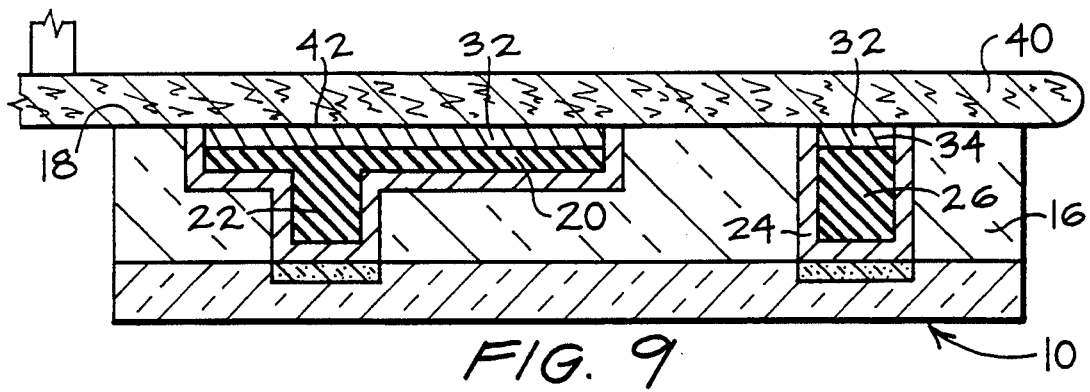

Referring now to FIG. 9, the second polish completely removes titanium-tungsten 34 and titanium-tungsten 24 on or above surface 18, and completely removes titanium-tungsten 34 above channels 20 and vias 22. It should be noted that upper portions 32 of channels 20 and vias 22 remain completely filled with titanium-tungsten 34. Ideally, little or no silicon oxide 16 is removed during the second polish. Notwithstanding, silicon oxide 16 must be left with a smooth, planar top surface. Consequently, planar top surface 42 of titanium-tungsten 34 remaining in channels 20 and vias 22 is aligned with planar top surface 18 of silicon oxide 16. It is understood that any titanium-tungsten 24 on the top surface of substrate 10 (between silicon oxide 16 and copper 26) is also aligned with surfaces 18 and 42.

Figure 10:
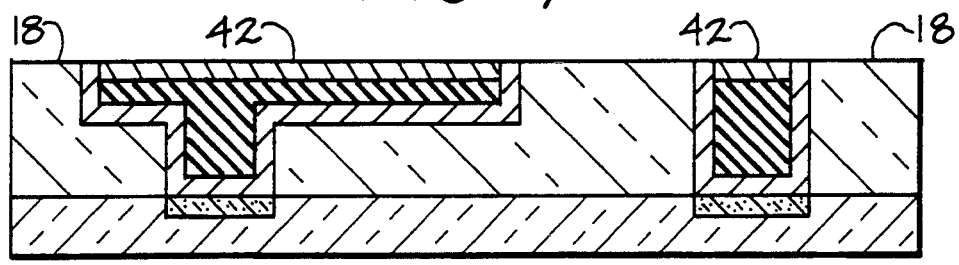

Referring now to FIG. 10, the second polish is removed and a first metallization layer (or bi-layer) has been formed in accordance with the present invention.

The present invention is well-suited to forming multilayer structures. Therefore, while not mandatory, a second layer of metallization is formed FIGS. 11–16 by repeating the process steps of FIGS. 1–10.

Figure 11:
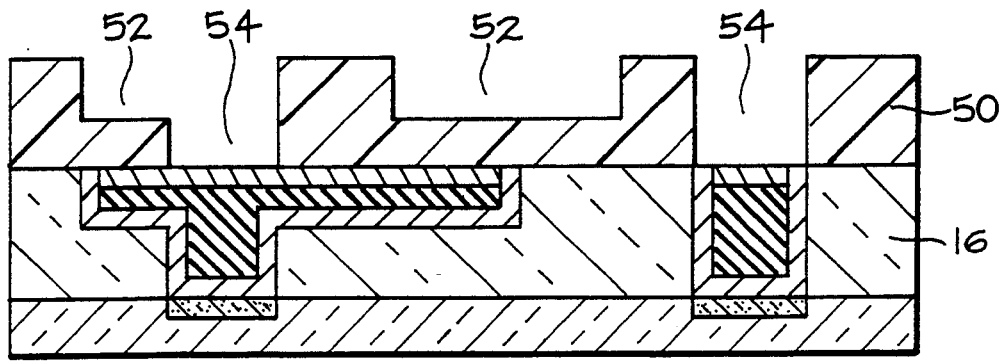
FIGS. 11, 12, 13, 14, 15, and 16 show successive cross-sectional views of forming a second metallization layer on the first layer formed in FIGS. 1–10.
Figure 12:
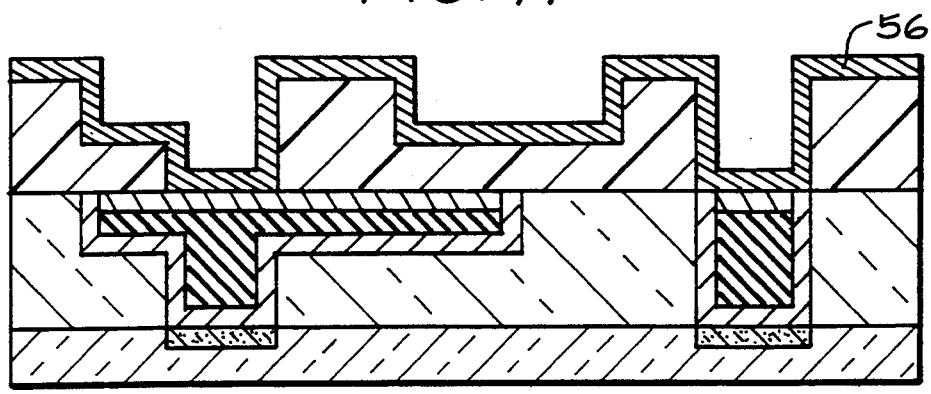
Figure 13:
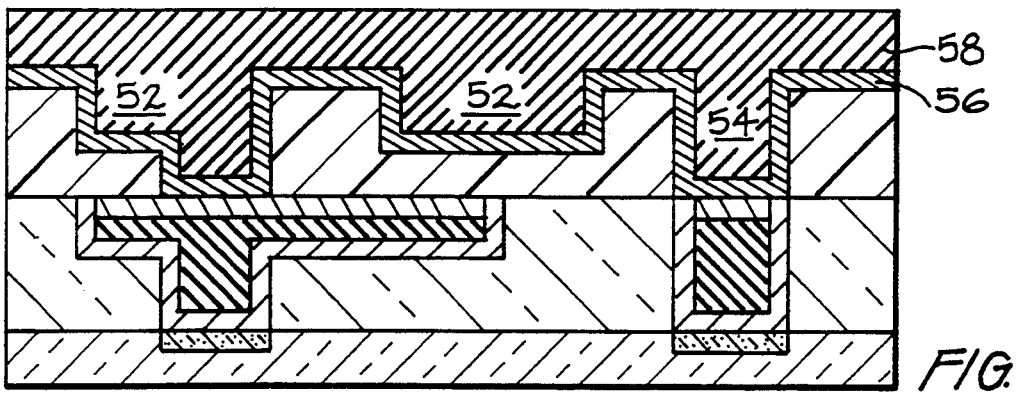
Figure 14:
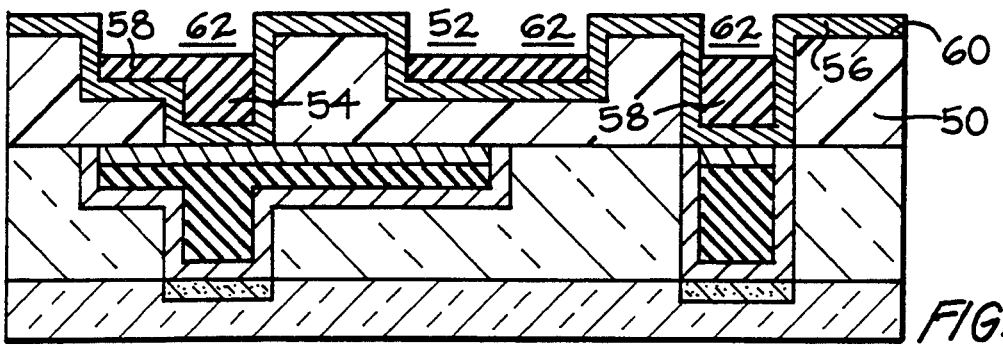
Figure 15:
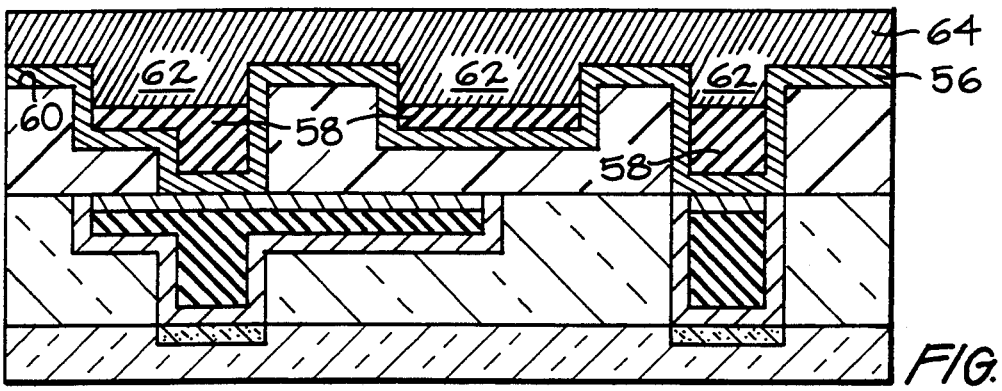
Figure 16:
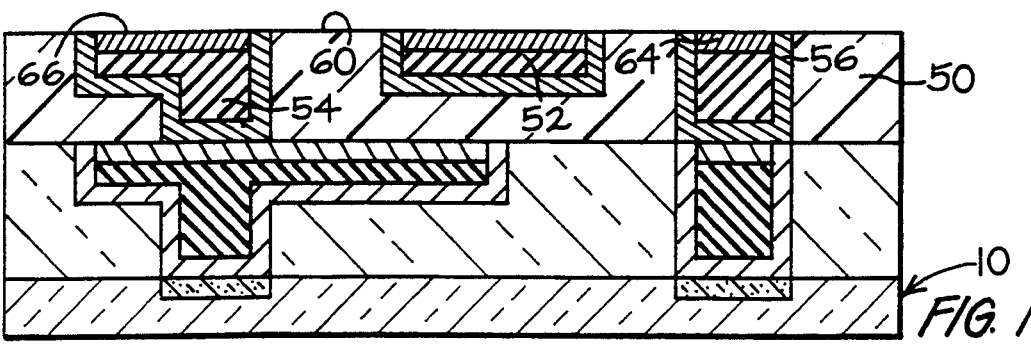

In FIG. 11, a layer of polyimide 50 is deposited on silicon oxide 16, and second channels 52 and second vias 54 are formed therein. In FIG. 12, a third titanium-tungsten layer 56 is deposited on the entire substrate, and in FIG. 13 a second copper layer 58 is deposited on the entire layer 56. In FIG. 14, copper 58 is polished (not shown) and etched to completely remove copper 58 from layer 56 over top surface 60 of polyimide 50, and from upper portion 62 of channels 52 and vias 54. In FIG. 15, a fourth layer of titanium-tungsten 64 is deposited over the entire substrate, completely filling upper portion 62. Finally, in FIG. 16, titanium-tungsten layers 56 and 64 are polished (not shown) thereby removing layers 56 and 64 above top surface 60, and layer 64 above channels 52 and vias 54. As a result, substrate 10 exhibits a planar top surface which includes top surface 66 of titanium-tungsten 64 aligned with top surface 60 of polyimide 50.

Figure 17:
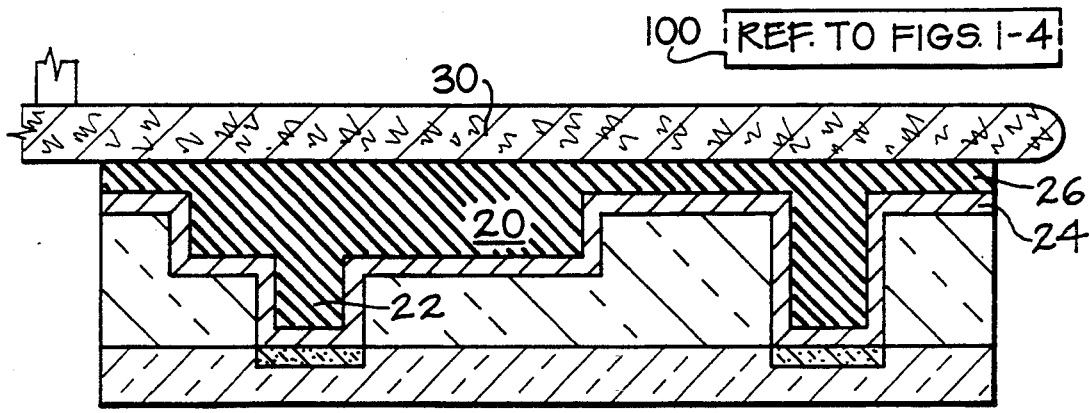
FIGS. 17, 18, and 19 show an alternative embodiment for FIGS. 5–6.
Figure 18:
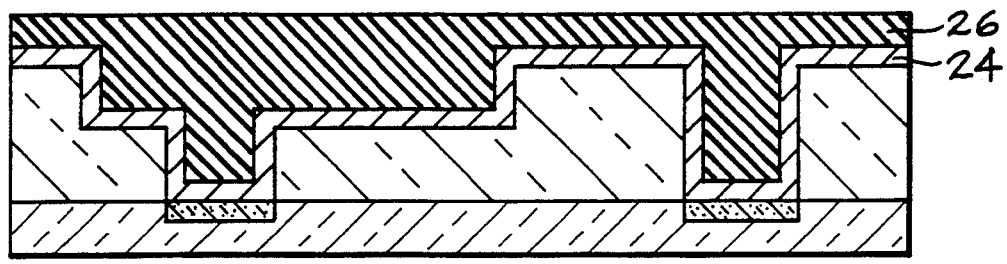
Figure 19:
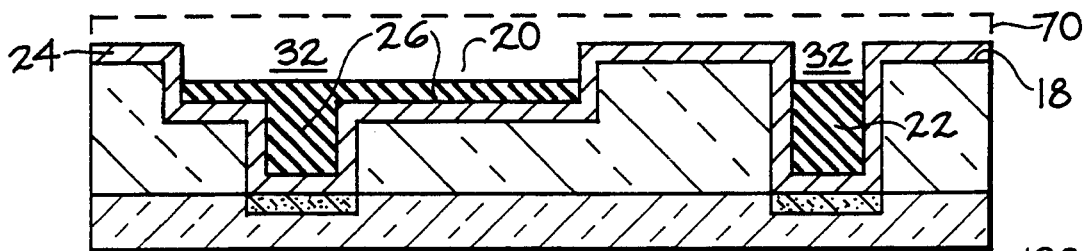

In the previous embodiments, the copper layers have been completely removed from above the channels and vias and from the top surface outside the channels and vias by polishing. The polishing, however, may be either partially or totally eliminated. In the embodiment of FIGS. 17–19, the copper is partially polished and solely wet etched thereafter; in the embodiment of FIG. 20 the copper is removed completely by wet etching.

As another embodiment, FIGS. 17–19 replace FIGS. 5–6 such that the sequence proceeds as FIGS. 1–4, 17–19, and 7–10. Thus, before FIG. 17 the process of FIGS. 1–4 (depicted by reference character 100) is performed. In FIG. 17, instead of polishing copper 26 until copper 26 is completely removed from titanium-tungsten 24 outside channels 20 and vias 22 (as shown in FIG. 5), copper 26 is partially polished but not entirely removed from titanium-tungsten 24. In FIG. 18 polishing pad 30 is removed, and in FIG. 19 a wet chemical etch is applied which anisotropically removes copper 26 (beginning at broken lines 70) from titanium-tungsten 2 top surface 18 and from upper portion 32 of channels 20 and vias 22. This yields the same structure as seen in FIG. 6. Thereafter, the process of FIGS. 7–10 (depicted by reference character 102) is performed.

Figure 20:
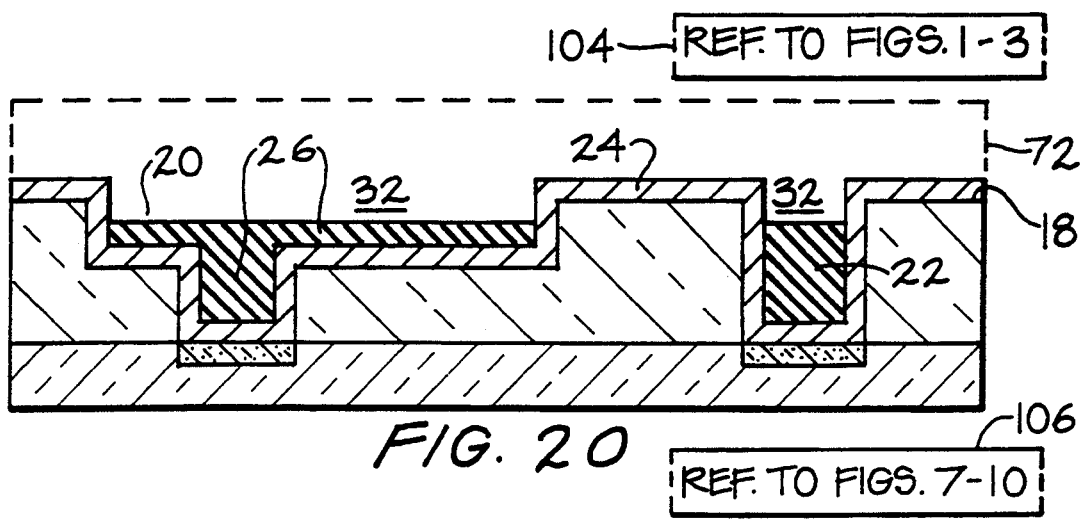
FIG. 20 shows another alternative embodiment for FIGS. 4–6.

As a further embodiment, FIG. 20 replaces FIGS. 4–6 such that the sequence proceeds as FIGS. 1–3, 20, and 7–10. Thus, before FIG. 20 the process of FIGS. 1–3 (depicted by reference character 104) is performed. In FIG. 20 no polishing occurs, instead, a wet chemical etch (similar to FIG. 19) anisotropically removes copper 26 (beginning at broken lines 72) from titanium-tungsten 24 on top surface 18 and from the upper portions 32 to yield the same structure as seen in FIG. 6. Thereafter, the process of FIGS. 7–10 (depicted by reference character 106) is performed.

In the previous embodiments, copper layer 26 was blanket deposited over the entire top surface of titanium-tungsten 24, which was blanket deposited over the entire substrate. The copper, however, may be selectively deposited by selectively patterning the titanium-tungsten 24 in channels 20 and vias 22. In the embodiment of FIGS. 21–25, the titanium-tungsten on top surface 18 is removed before copper 26 is deposited so that copper 26 can be selectively deposited in the titanium-tungsten 24 remaining in the channels 20 and vias 22.

Figure 21:
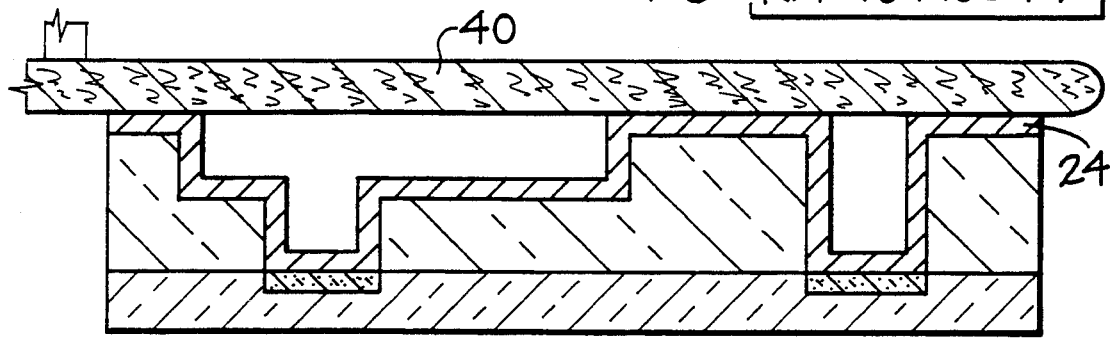
FIGS. 21, 22, 23, 24, and 25 show an alternative embodiment for FIGS. 3–6.
Figure 22:
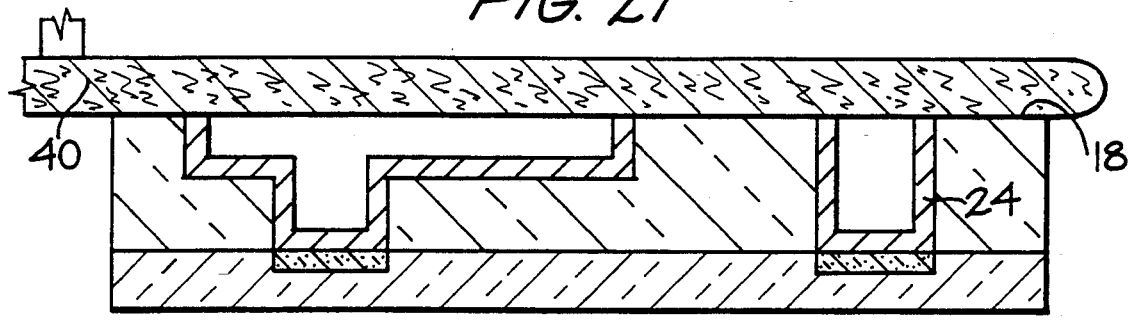
Figure 23:
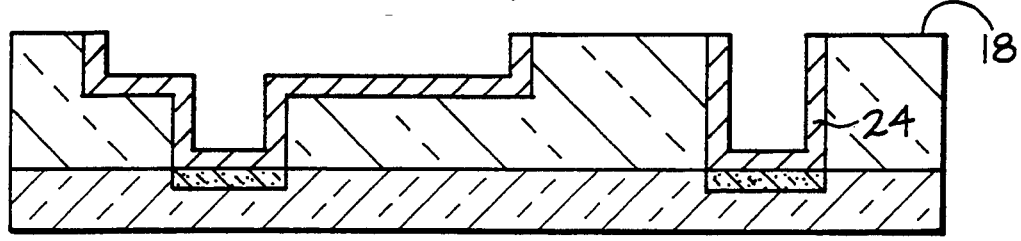
Figure 24:
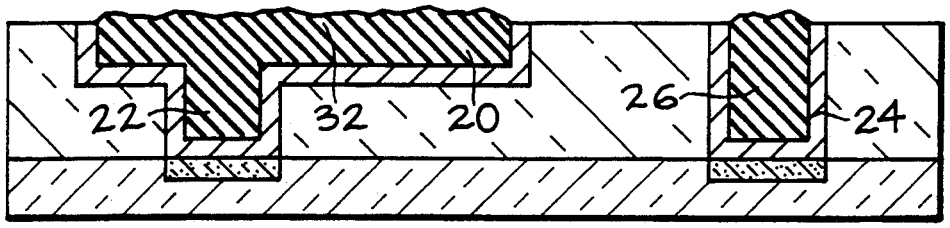
Figure 25:
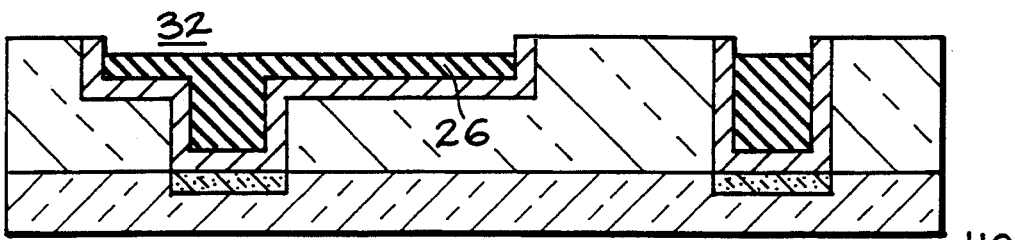

As still a further embodiment, FIGS. 21–25 replace FIGS. 3–6 such that the sequence proceeds as FIGS. 1–2, 21–25, and 7–10. Thus, before FIG. 21 the process of FIGS. 1–2 (depicted by reference character 108) is performed. In FIG. 21, polishing pad 40 is applied to titanium-tungsten layer 24, and in FIG. 22 pad 40 completely removes titanium-tungsten layer 24 above top surface 18. In FIG. 23, pad 40 is removed. In FIG. 24, copper 26 is selectively deposited on the remaining titanium-tungsten 24 in channels 20 and vias 22 so as to completely fill upper portions 32. Finally, in FIG. 25, copper 26 in upper portions 32 is removed (whether by polishing, wet chemical etching or the like). This yields the same structure as seen in FIG. 6. Thereafter, the process of FIGS. 7–10 (depicted by reference character 110) is performed. Copper 26 may be selectively deposited, for instance by selective metal organic chemical vapor deposition, or by electroless deposition. These techniques are well-known to those skilled in the art.

The following non-limiting examples are provided to further illustrate the polishing steps herein. These examples are meant to illustrate and not to limit the invention, the scope of which is defined solely by the appended claims.

EXAMPLE 1

A slurry mixture 2:2:1-Nalco 2354 (commercial colloidal silica typically used in polishing slurries) (2): deionized water (2): 0.3 molar sodium chlorite (1), slurry flow 100 ml/min total, 100 rpm carrier and platen, Rodel Suba IV perforated polish pad, 3 PSI, polishing a 100 mm silicon wafer with 5000 angstroms silicon oxide, 1000 angstroms titanium-tungsten, and 1 micron copper. In two trials the 1 micron copper was removed in 5 and 5.5 minutes, respectively, leaving the titanium-tungsten intact.

EXAMPLE 2

Using the same slurry formation as Example 1, mounting the Rodel Suba IV pad on top of a Rodel GS pad, a 100 mm silicon substrate with patterned dual trench silicon oxide containing various feature sizes, barrier metal, and approx. 0.5 microns of blanket copper plated on top, the copper was polished at 100–125 rpm, 3 psi, for 17 minutes. The blanket copper was polished away leaving the copper features in co-planarity with the silicon oxide with no noticeable recess in the copper features. An increase in the removal rate was achievable by increasing the platen rpm and/or increasing the polish pressure.

Finally, it is important to note that forementioned illustrations and examples are only exemplary. For instance, the channels 20 and vias 22 may more generally be indentations or recesses in an insulating layer. Suitable insulating layers include oxides, polymers such as polymide, and ceramics such as alumina ceramic or glass ceramic. The insulating layer may be disposed on an organic or inorganic insulator, a semiconductor or a conductor, and may be part of a multilayer structure, in a wide variety of electronic components (active or passive) including integrated circuit chips, multi-chip modules, and flexible interconnect tapes. The titanium-tungsten layers 24 and 34 may be other metals which provide adhering diffusion barriers, including titanium, tungsten, tantalum, nichrome, nickel, or chromium, as well as silicides thereof (e.g., $TiSi_2$, $TaSi_2CrSi_2$) and combinations thereof, and may be deposited by other suitable techniques such as chemical vapor deposition or physical vapor deposition (e.g., evaporation). The copper may, more generally, be any good conducting metal such as gold, silver or aluminum, and may be disposed on the substrate by numerous techniques such as chemical vapor deposition and physical vapor deposition. Furthermore, various techniques may be used to remove copper 26 from upper portions 32. That is, a hard pad can be used with a suitable wet chemical etchant, or a soft pad may be used without a wet chemical etchant. In addition, larger features will ordinarily result in removing (or "dishing") a greater thickness of copper beneath the barrier surface.

The present invention may suitably comprise, consist of, or consist essentially of the forementioned process steps. Furthermore, the layers of the present invention may comprise, more preferably consist essentially of, and most preferably consist of the described metal features surrounded by the first and second barrier materials within the insulating layer.

The present invention, therefore, is well adapted to carry out the objects and attain the ends and advantages mentioned, as well as others inherent therein. While presently preferred embodiments of the present invention have been described for the purpose of disclosure, numerous other changes in the details of construction, arrangement of parts, compositions and materials selection, and processing steps can be carried out without departing from the spirit of the present invention which is intended to be limited only by the scope of the appended claims.

What is claimed is:

1. A method of forming a metal feature surrounded by a diffusion barrier in a recess in a planar insulating layer of a substrate, comprising the steps of:
   providing a substrate having an insulating layer with a top surface and a recess in and extending below the top surface;
   depositing a first barrier material on all surfaces in the recess and on at least a portion of the top surface of the insulating layer;
   depositing a conductive metal on the entire first barrier material in the recess wherein the conductive metal fills the entire recess above the first barrier material and extends above the recess;
   removing all of the first barrier material on the top surface of the insulating layer;
   removing a top portion of the conductive metal within the recess without removing all of the conductive metal within the recess;
   depositing a second barrier material on the conductive metal within the recess and over the top surface of the insulating layer after removing the top portion of the conductive metal within the recess; and
   planarizing the substrate by polishing the second barrier material until the top surface of the second barrier material in the recess is aligned with the top surface of the insulating layer.

2. The method of claim 1, further including:
   removing all the first barrier material on the top surface of the insulating layer by polishing; and then
   depositing the conductive metal on the entire first barrier material in the recess without depositing the conductive metal over the top surface of the insulating layer and without contacting the conductive metal to the insulating layer.

3. The method of claim 2, further including:
   depositing the conductive metal by one of chemical vapor deposition or electroless deposition.

4. The method of claim 1, further including:
   depositing the conductive metal on the first barrier material over the top surface of the insulating layer;
   removing the conductive metal on the first barrier material over the top surface of the insulating layer;
   depositing the second barrier material on the first barrier material over the top surface of the insulating layer;
   removing the second barrier material on the first barrier material over the top surface of the insulating layer; and then
   removing the first barrier material on the top surface of the insulating layer.

5. The method of claim 4, further including:
   removing the conductive metal solely by wet chemical etching.

6. The method of claim 4, further including:
   removing at least a portion of the conductive metal on the first barrier material over the top surface of the insulating layer and above the recess by polishing.

7. The method of claim 6, further including:
   removing the conductive metal on the first barrier material over the top surface of the insulating layer and above the recess by polishing.

8. The method of claim 7 wherein the polishing comprises a rotating pad and a wet chemical selected from the group consisting of oxidizers, reducers and etchants which attack and remove the conductive metal over the top surface of the insulating layer without removing the first barrier material.

9. The method of claim 1 wherein the first and second barrier materials are selected from the group consisting of titanium, tungsten, tantalum, nichrome, nickel, chromium, silicides thereof, and combinations thereof.

10. The method of claim wherein the conductive metal is selected from the group consisting of copper, gold, silver and aluminum.

11. The method of claim 1 wherein the insulating layer is selected from the group consisting of silicon oxide, polymers and ceramics.

12. The method of claim 1 wherein the first barrier material is uniformly deposited over the entire insulating layer, the conductive metal is uniformly deposited over the entire first barrier material, and the second barrier material is uniformly deposited over the entire conductive metal.

13. A method of forming a metal feature surrounded by an adhering diffusion barrier in a multilevel electronic component, comprising the following steps in the sequence set forth:
   providing a substrate with a first insulating layer and a base material, the first insulating layer with a recess in and extending below a planar top surface, the recess extending through the entire thickness of the first insulating layer and exposing the base material therebeneath;
   depositing a first barrier material on all surfaces in the recess, on the exposed base material, and on the entire top surface of the first insulating layer, the first barrier material making adhesive contact with the first insulating layer and with the base material;
   depositing a conductive metal on the entire first barrier material such that the conductive metal entirely fills the portion of the recess above the first barrier material, the conductive metal makes adhesive contact and electrical contact with the first barrier material, and the first barrier material prevents the conductive metal from diffusing into the insulating layer;
   removing the conductive metal from the top surface of the first insulating layer, from above the recess, and from a top portion of the recess by polishing, the polishing comprising a rotating pad and a wet chemical which attacks the conductive metal without removing the first barrier material;
   depositing a second barrier material on the entire top surface of the conductive metal in the recess, within the entire portion of the recess above the conductive metal, and over entire top surface of the first insulating layer, the second barrier material being an electrical conductor and making adhesive contact and electrical contact with the conductive metal, the first and second barrier materials completely surrounding the conductive metal;

planarizing the substrate by polishing the second barrier material until the second barrier material is completely removed from the top surface of the first insulating layer and the second barrier material remaining in the recess is aligned with the top surface of the first insulating layer; and depositing a second insulating layer on the top surface of the first insulating layer and the second barrier material wherein the second insulating layer makes adhesive contact with the first insulating layer and with the second barrier material and the second barrier material prevents the conductive metal from diffusing into the second insulating layer.

14. The method of claim 13, further comprising, in sequence, forming a second recess extending through the entire thickness of the second insulating layer and exposing the second barrier material therebeneath;

depositing a third barrier material on all surfaces in the second recess, on the exposed second barrier material and on the entire top surface of the second insulating layer, the third barrier material making adhesive contact with the second insulating layer and with the second barrier material;

depositing a second conductive metal on the entire third barrier material such that the second conductive metal entirely fills the portion of the second recess above the third barrier material, the second conductive metal makes adhesive contact and electrical contact with the third barrier material, and the third barrier material prevents the second conductive metal from diffusing into the second insulating layer;

removing the second conductive metal from the top surface of the second insulating layer, from above the second recess, and from a top portion of the second recess by a second polishing, the second polishing comprising a second rotating pad and a second wet chemical which attacks the second conductive metal without removing the third barrier material;

depositing a fourth barrier material on the entire top surface of the second conductive metal in the second recess, within the entire portion of the second recess above the second conductive metal, and over the entire top surface of the second insulating layer, the fourth barrier material being an electrical conductor and making adhesive contact and electrical contact with the second conductive metal, the third and fourth barrier material completely surrounding the second conductive metal; and planarizing the substrate by polishing the fourth barrier material until the fourth barrier material is completely removed from the top surface of the second insulating layer and the fourth barrier material remaining in the second recess is aligned with the top surface of the second insulating layer.

15. The method of claim 14 wherein the first, second, third and fourth barrier materials are the same material.

* * * * *